(12) United States Patent
Paramanandam et al.

(10) Patent No.: US 9,369,122 B2
(45) Date of Patent: Jun. 14, 2016

(54) LOW PHASE NOISE TECHNIQUE FOR A CRYSTAL OSCILLATOR CIRCUIT

(71) Applicant: Marvell World Trade Ltd., St. Michael (BB)

(72) Inventors: Arvind Anumula Paramanandam, Pleasanton, CA (US); Norman Liu, San Mateo, CA (US); Prasanna Upadhyaya, San Jose, CA (US); Xiaoyue Wang, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/838,222

(22) Filed: Aug. 27, 2015

(65) Prior Publication Data

US 2016/0072497 A1 Mar. 10, 2016

Related U.S. Application Data

(60) Provisional application No. 62/046,774, filed on Sep. 5, 2014.

(51) Int. Cl.
*H03B 5/36* (2006.01)
*H03K 17/16* (2006.01)

(52) U.S. Cl.
CPC .............. *H03K 17/161* (2013.01); *H03B 5/362* (2013.01); *H03B 5/364* (2013.01); *H03B 2200/009* (2013.01)

(58) Field of Classification Search
CPC .............. H03B 5/30; H03B 5/32; H03B 5/36; H03B 5/362; H03B 5/364; H03B 2200/0088; H03B 2200/009
USPC ........... 331/116 FE, 116 M, 116 R, 154, 158, 331/185, 186
See application file for complete search history.

(56) References Cited

U.S. PATENT DOCUMENTS

| | | | |
|---|---|---|---|
| 6,909,336 B1* | 6/2005 | Rajagopalan | H03L 5/00 331/109 |
| 7,187,245 B1* | 3/2007 | McMenamy | H03B 5/36 331/158 |
| 8,704,605 B1* | 4/2014 | Sinitsky | H03B 5/362 331/116 FE |
| 2004/0130404 A1 | 7/2004 | Ruffieux | |
| 2006/0255871 A1* | 11/2006 | Kamiya | H03B 5/364 331/158 |
| 2007/0024385 A1* | 2/2007 | Greenberg | H03L 5/00 331/158 |
| 2008/0252390 A1* | 10/2008 | Guerreiro | H03B 5/32 331/116 FE |
| 2009/0146751 A1 | 6/2009 | Pernia et al. | |
| 2009/0224836 A1 | 9/2009 | Orberk et al. | |

FOREIGN PATENT DOCUMENTS

EP 1753126 2/2007

OTHER PUBLICATIONS

"International Search Report and Written Opinion", Application No. PCT/US2015/047288, Nov. 26, 2015, 10 pages.

* cited by examiner

*Primary Examiner* — Levi Gannon

(57) ABSTRACT

In aspects of a low phase noise technique for use with a crystal oscillator, a bias control circuit sets a bias voltage on the gate of a first transistor needed to sink or source an amount of current corresponding to a sensed common mode signal. The sensed common mode signal is sensed with a common mode sense circuit that is coupled across two ports of the crystal oscillator, and current is provided by a current source. The bias voltage is set by a bias controller that uses a second transistor coupled to the common mode sense circuit and the first transistor.

20 Claims, 6 Drawing Sheets

LOW PHASE NOISE TECHNIQUE FOR A CRYSTAL OSCILLATOR CIRCUIT

CROSS REFERENCE TO RELATED APPLICATION(S)

This application claims priority to U.S. Provisional Patent Application Ser. No. 62/046,774 filed Sep. 5, 2014, the disclosure of which is incorporated herein by reference.

BACKGROUND

Crystal oscillators are workhorses of modern computing devices, providing stable references used to derive clocks, tones, and waveforms that set performance limits of the computing devices. For example, a crystal oscillator may be used to derive a system clock of an application-specific integrated circuit (ASIC), and performance of the ASIC may depend on the stability of the oscillator and system clock derived from it. Therefore, the ASIC may contain circuitry to compensate for losses in the crystal oscillator and losses due to coupling the crystal oscillator to the ASIC.

Circuitry on a chip, a field-programmable gate array (FPGA), a processor, or ASIC coupled with a crystal oscillator may include compensation and control circuitry, such as sense circuitry and bias control circuitry that are designed to set a bias voltage on a transistor connected across two ports of the crystal oscillator. The sense circuitry senses a common mode signal across the two ports of the crystal oscillator, and the bias control circuitry sets a bias voltage on the transistor to compensate for loss. Often, the bias control circuitry includes an operation amplifier (op-amp) driven on one input with a voltage provided by a voltage reference generator. The op-amp and voltage reference generator, however, introduce noise and may not be suitable for use with some protocols and standards. For example, IEEE 802.11ac requires phase noise performance that may not be achievable with available op-amps and voltage reference generators.

SUMMARY

This summary introduces concepts of a low phase noise technique implemented with a bias control circuit for use with a crystal oscillator, and the concepts are further described below in the detailed description and/or shown in the figures. Accordingly, this summary should neither be considered to describe essential features nor used to limit the scope of the claimed subject matter.

In one aspect, an electronic circuit can be implemented to control a crystal oscillator. A common mode sense circuit is coupled to two ports of the crystal oscillator and can sense a common mode signal across the two ports. A first transistor is also coupled to the two ports of the crystal oscillator. A bias controller is implemented to set a bias voltage on a gate of the first transistor based on the sensed common mode signal. The bias controller includes a second transistor, a gate of the second transistor is coupled to the common mode sense circuit, and a source of the second transistor is resistively coupled to the gate of the first transistor.

A method is described for controlling a crystal oscillator, the method including coupling a common mode sense circuit to two ports of the crystal oscillator. The method includes sensing a common mode signal across the two ports of the crystal oscillator. The method also includes coupling a first transistor to the two ports of the crystal oscillator, coupling a gate of a second transistor in a bias controller to the common mode sense circuit, and coupling a source of the second transistor in the bias controller to a gate of the first transistor. A bias voltage is set with the bias controller on the gate of the first transistor based on the sensed common mode signal.

A system is described that includes a crystal oscillator. The system also includes a common mode sense circuit coupled to two ports of the crystal oscillator and implemented to sense a common mode signal across the two ports. The system also includes a first transistor coupled to the two ports of the crystal oscillator, and includes a bias controller. The bias controller includes a second transistor with a gate coupled to the common mode sense circuit and a source coupled to the gate of the first transistor, and the bias controller is implemented to set a bias voltage on the gate of the first transistor based on the sensed common mode signal.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the accompanying drawings and the non-limiting detailed description set forth herein.

BRIEF DESCRIPTION OF THE DRAWINGS

Details of a low phase noise technique implemented with a bias control circuit for use with a crystal oscillator are described with reference to the following Figures. The same numbers may be used throughout to reference like features and components that are shown in the Figures.

DETAILED DESCRIPTION

In aspects of a low phase noise technique implemented with a bias controller for use with a crystal oscillator, an electronic circuit controls the crystal oscillator. A common mode sense circuit is coupled to two ports of the crystal oscillator and is implemented to sense a common mode signal across the two ports. A first transistor is also coupled to the two ports of the crystal oscillator. A bias controller is implemented to set a bias voltage on a gate of the first transistor based on the sensed common mode signal. The bias controller includes a second transistor, a gate of the second transistor is coupled to the common mode sense circuit, and a source of the second transistor is resistively coupled to the gate of the first transistor.

In aspects of the low phase noise technique implemented with a bias controller for use with a crystal oscillator, the common mode sense circuit may be implemented with a pair of equally-valued resistors. Additionally, the common mode sense circuit, the first transistor, and the bias controller can be implemented as a first chip, such as a system-on-chip (SoC), and the crystal oscillator can be implemented as a second chip.

In other aspects of the low phase noise technique implemented with a bias controller for use with a crystal oscillator, the first transistor can be coupled to a current source, and the bias voltage is further set according to an amount of current to or from the current source. The gate of the first transistor can be coupled with a capacitor to clock distribution circuitry, and the clock distribution circuitry may generate clocks for processing of signals compliant with an IEEE 802.11 standard, such as 802.11ac. Further, the source of the second transistor can be coupled to a grounded capacitor and a grounded resistor.

While features and concepts of a low phase noise technique for a crystal oscillator can be implemented in any number of different devices, systems, environments, and/or configurations, aspects of a low phase noise technique for a crystal oscillator are described in the context of the following example devices, systems, and methods.

Figure 1:
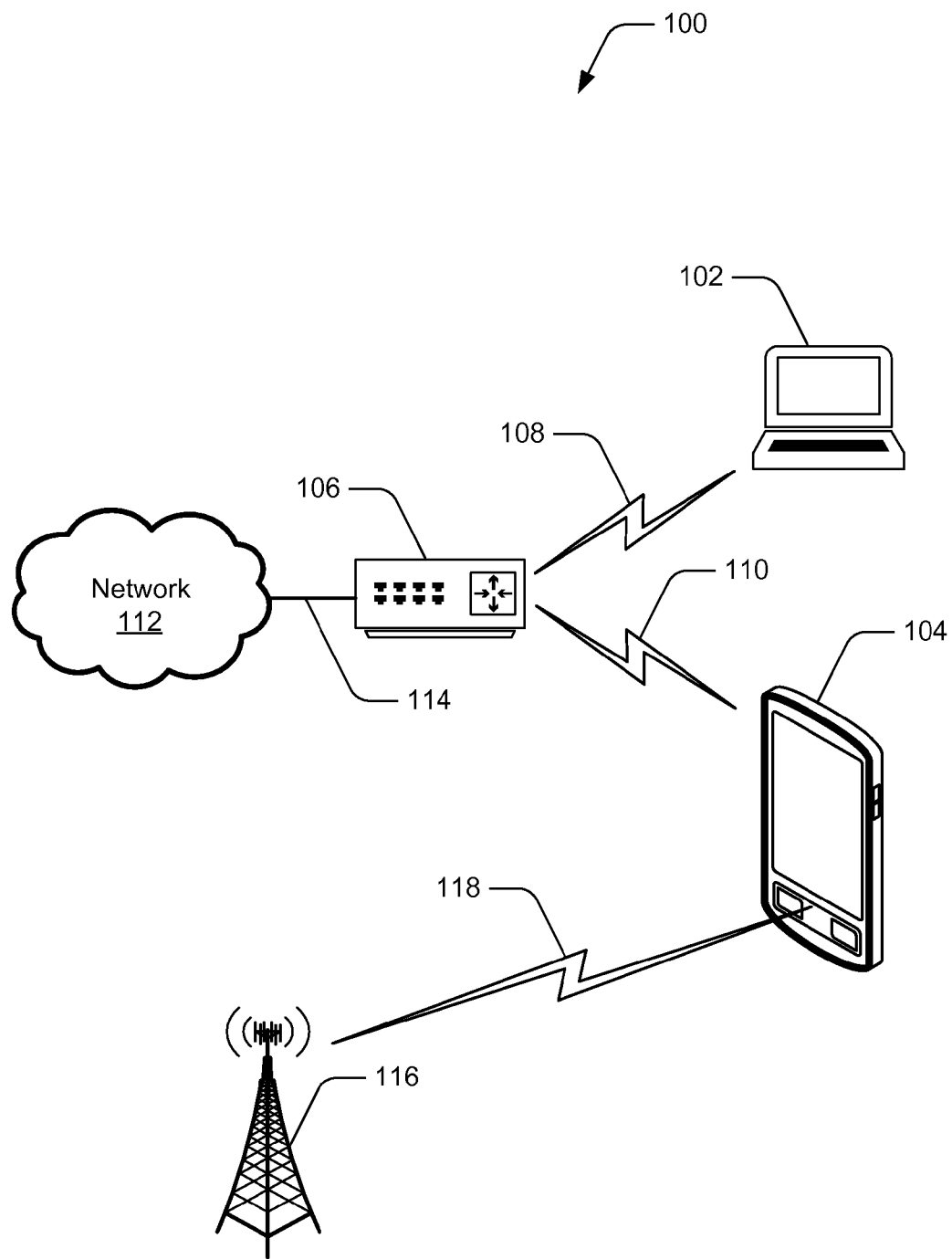
FIG. 1 illustrates an operating environment including various computing devices in which aspects of a bias control circuit for use with a crystal oscillator can be implemented.

FIG. 1 illustrates an environment 100 including various computing devices in which aspects of a low phase noise technique implemented with a bias controller for use with a crystal oscillator can be implemented. In this example environment 100, a first user device 102 and a second user device 104 can each include a bias controller for use with a crystal oscillator. The first user device 102 is illustrated as a laptop computer, and the second user device 104 is illustrated as a cellular phone, and more specifically as a smart phone. It is to be appreciated, however, that the first user device 102 and/or the second user device 104 can be any suitable type of computing device, such as a tablet, a set-top box, satellite receiver, cable television receiver, access point, desktop computer, gaming device, vehicle navigation system, and the like.

In this example, the first user device 102 and the second user device 104 include communication capabilities, and are configured to communicate with a router 106, illustrated by a communication link 108 and a communication link 110, respectively. The communication link 108 and/or the communication link 110 may be implemented as a wireless connection, wired connection, or a combination thereof. Furthermore, the communication link 108 and/or the communication link 110 may be one-way or two-way (i.e., bi-directional) communication links. In an aspect of the disclosure, the communication link 108 and the communication link 110 represent a communication link using signals compliant with an IEEE 802.11 Wi-Fi standard, such as IEEE 802.11ac.

The router 110 is implemented to communicate with the first user device 102 and the second user device 104, for example by sending and receiving information using a modem. The router 110 is also connected to a network 112 via a connection 114. The network 112 may be the Internet, an intranet, a local area network (LAN), wide area network (WAN), body area network (BAN), and the like. Therefore, the connection 114 may be a wireless connection, wired connection, or a combination thereof. For example, the router 106 may connect the first user device 102 to the Internet by using an Ethernet cable to connect to the Internet and a wireless Wi-Fi link to connect to the first user device 102. The router 106 can communicate data from the first user device 102 and/or from the second user device 104 to the network 112. In addition, the router 106 can communicate data from the network 112 to the first user device 102 and/or to the second user device 104. The data may include video, audio, photographs, text, voice, and/or files, and the like. Furthermore, although the router 106 is illustrated as a separate component from the first user device 102 and the second user device 104, either of the first user device 102 and/or the second user device 104 can include the router 106 as a component, and thereby communicate with the network 112 directly.

The second user device 104 (e.g., a mobile device, such as a mobile phone or tablet device) also communicates with a cell tower 116 via a communication link 118. In an example, the communication link 118 is a wireless link. The cell tower 116 may be a single cell tower, or multiple cell towers arranged in a network and configured to allow the second user device 104 to move from location to location without losing a communication link. For example, each of the cell towers can transfer its respective communication link with the second user device 104 to another cell tower using the common "handoff" technique. Furthermore, it is to be appreciated that the cell tower 116 is for discussion purposes, and can be any other suitable type of device, such as a satellite, cable television head-end, terrestrial television broadcast tower, device connected with a USB cable or Ethernet cable, and the like. Accordingly, communication with the second user device 104 via the communication link 118 can occur over a wired connection, wirelessly, or a combination thereof.

The first user device 102, the second user device 104, and/or the router 106 may embody aspects of the disclosure. For example, the first user device 102, the second user device 104, and/or the router 106 may include a crystal oscillator, and embody aspects of a bias control circuit implemented with a bias controller for use with the crystal oscillator. The first user device 102, the second user device 104, and/or the router 106 may also include general purpose and/or special purpose processors, ASICs, field-programmable gate arrays (FPGAs), application-specific standard products (ASSPs), system-on-a-chip systems (SoCs), and/or complex programmable logic devices (CPLDs), any of which may be clocked with signals derived from aspects of a bias control circuit that is implemented with a bias controller for use with a crystal oscillator.

Figure 2:
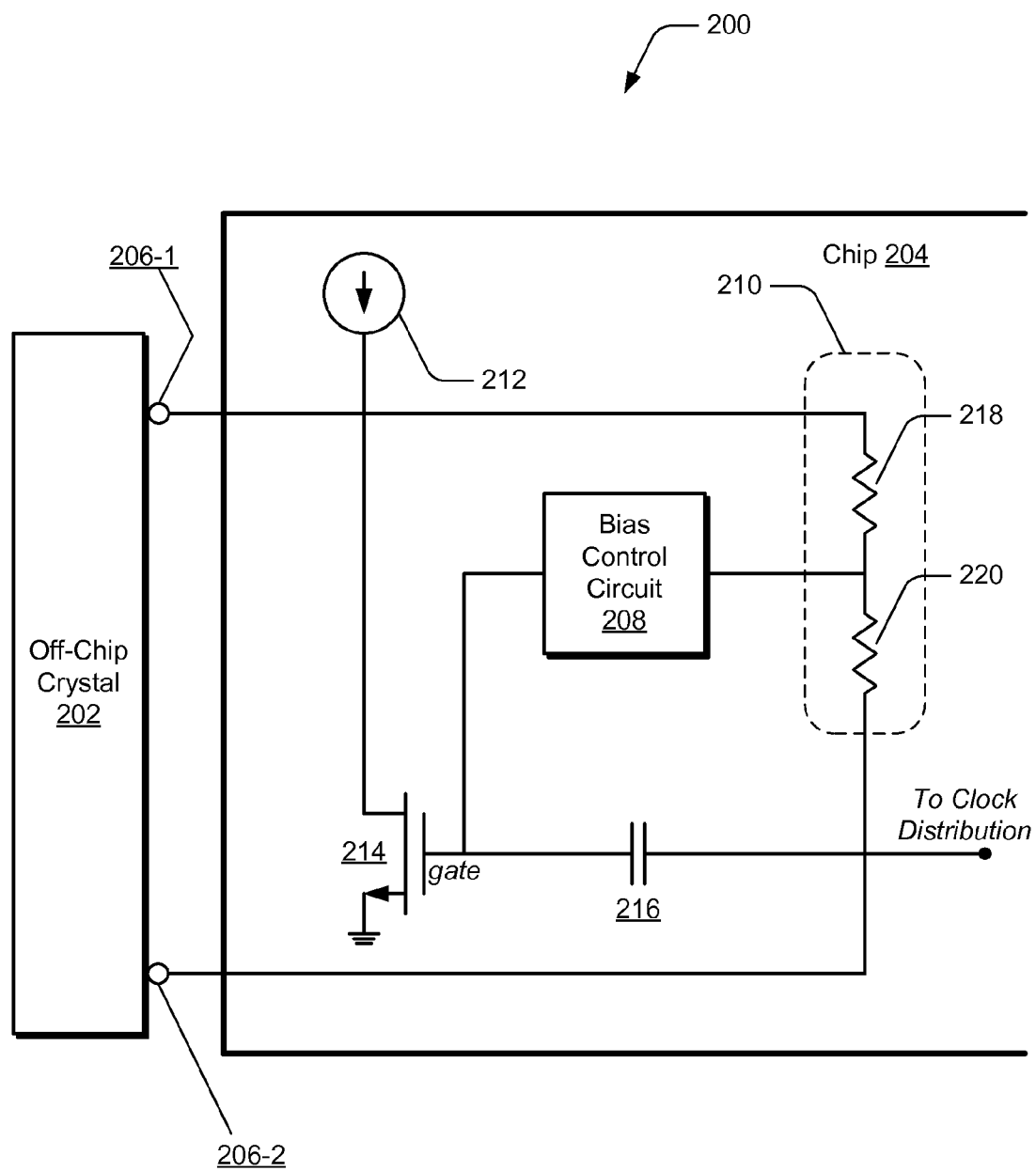
FIG. 2 illustrates an example circuit in which aspects of a bias controller for use with a crystal oscillator can be implemented.

FIG. 2 illustrates an example circuit 200 in which aspects of a low phase noise technique implemented with a bias controller for use with a crystal oscillator can be implemented. The example circuit 200 includes an off-chip crystal 202 and chip 204. The chip 204 may be an ASIC, general purpose processor, special purpose processor, field-programmable gate array (FPGA), application-specific standard product (ASSPs), system-on-a-chip (SoC), complex programmable logic devices (CPLDs), combinations thereof, and the like. In an aspect of the disclosure, the off-chip crystal 202 is a separate chip package than the chip 204. In another aspect of the disclosure, the off-chip crystal 202 is a separate dice than the chip 204, and the off-chip crystal 202 and the chip 204 are packaged in a same chip package.

In this example, the off-chip crystal 202 includes a crystal oscillator and ports 206-1 and 206-2, and is coupled to the chip 204 using the ports 206-1 and 206-2. The ports 206 can each be configured as an input port or as an output port, and the ports enable signal transfer between the off-chip crystal 202 and the chip 204. Alternatively, the ports 206 are dedicated, so that one of ports 206-1 or 206-2 is an input port, and the other is an output port. In an aspect of the disclosure, the port 206-1 transfers an output signal from the off-chip crystal 202 to the chip 204, and the port 206-2 transfers an input signal from the chip 204 back to the off-chip crystal 202. The off-chip crystal 202 may use the input signal received from the chip 204 to adjust an output signal from the off-chip crystal 202, such as an output signal of an oscillatory component at a desired frequency.

The chip 204 includes circuitry to compensate for loss and provide input to the off-chip crystal 202. Loss may be due to imperfections in a crystal oscillator that includes the off-chip crystal 202, and may include signal variations in amplitude, phase, and/or frequency. Furthermore, loss may be due to imperfections in implementing the off-chip crystal 202, the ports 206, and/or the chip 204, such as non-ideal bonding, soldering, routing, placement, and the like.

The chip 204 includes a bias control circuit 208, a common mode sense circuit 210, a current source 212, and a transistor 214, which is coupled to the ports 206-1 and 206-2 of the off-chip crystal 202. For example, a drain of the transistor 214 is coupled to the port 206-1, and a gate of the transistor 214 is coupled to the port 206-2 through a capacitor 216. The drain of the transistor 214 is further coupled to the current source 212, and a source of the transistor 214 is grounded. The current source 212 is under amplitude control, and as such, may source or sink an amount of current required by the amplitude control. For example, the current source 212 may source or sink an amount of current according to an amount of swing in a sensed common mode signal. In an aspect of the disclosure, the transistor 214 is a field effect transistor (FET). In implementations, the bias control circuit 208, the common mode sense circuit 210, the current source 212, and/or the transistor 214 are implemented on a system-on-a-chip (SoC).

The common mode sense circuit 210 is coupled to the ports 206 of the off-chip crystal 202, and the common mode sense circuit can sense a common mode signal across the ports 206-1 and 206-2. In this example, the common mode sense circuit 210 is illustrated as including a first resistor 218 and a second resistor 220. In an aspect of the disclosure, the common mode sense circuit 210 includes a pair of equally-valued resistors. For example, a resistance value of the resistor 218 may be the same as, or similar to, a resistance value of the resistor 220. Further, the resistors 218 and 220 may be selected to minimize a difference between their respective resistance values, such as selected from a same lot and/or date of manufacture. The common mode sense circuit 210 is also coupled to the bias control circuit 208. As shown in the example, a signal from between the resistor 218 and the resistor 220 is coupled to the bias control circuit 208.

The bias control circuit 208 can include a bias controller that sets a voltage on a gate of the transistor 214 based on the sensed common mode signal from the common mode sense circuit 210. For example, the sensed common mode signal may include an amount of swing that requires a certain amount of current to or from the current source 212, and the bias control circuit 208 may set a voltage on a gate of transistor 214 to source or sink the required amount of current. The signal on the gate of the transistor 214 is coupled through the capacitor 216 for clock distribution, which can include clock distribution circuitry, such as an AC buffer, an amplifier, a phase-locked loop, a direct digital synthesizer, a filter, combinations thereof, and the like. The clock distribution circuitry can derive a system clock for components of the chip 204, such as a processor and/or logic gates (not shown).

Figure 3:
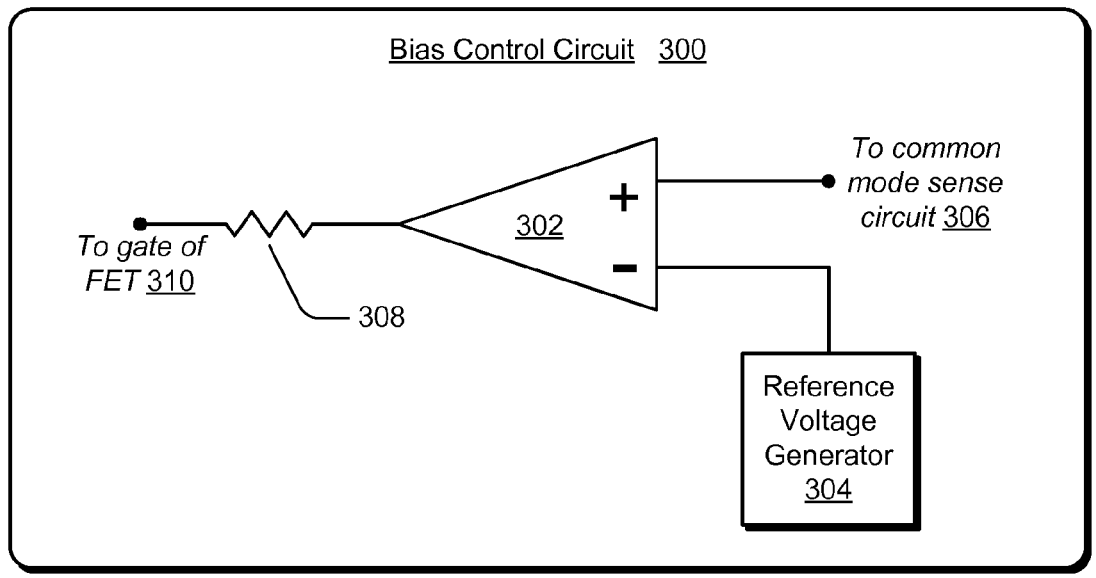
FIG. 3 illustrates a conventional bias control circuit that uses an operational amplifier coupled to a reference voltage generator.

FIG. 3 illustrates an example of conventional bias control circuit 300. It is common to use an operational amplifier (op-amp) 302 coupled to a reference voltage generator 304 that generates a reference voltage and is coupled to a negative terminal of the op-amp. The reference voltage generator 304 can also be coupled to a current source, such as described above. For simplicity, other circuit elements commonly implemented with an op-amp implementation and the reference voltage generator are not shown. A positive terminal of the op-amp 302 is coupled to a common mode sense circuit 306, such as between the resistors of the common mode sense circuit. A sensed common mode signal from the common mode sense circuit 306 is supplied to the positive terminal of op-amp 302, and since the op-amp 302 attempts to minimize a difference between positive and negative terminals, a required amount of current according to an amount of swing in the sensed common mode signal flows through a resistor 308, which is coupled to a gate of a transistor 310, which is coupled to the ports of an off-chip crystal. Since a required amount of current flows through the resistor 308, a bias voltage is thereby set on the gate of transistor 310. As noted above, noise may be introduced from the op-amp 302 and the reference voltage generator 304, and the noise can corrupt the signal supplied to clock distribution circuitry and therefore limit the performance of the circuit.

Figure 4:
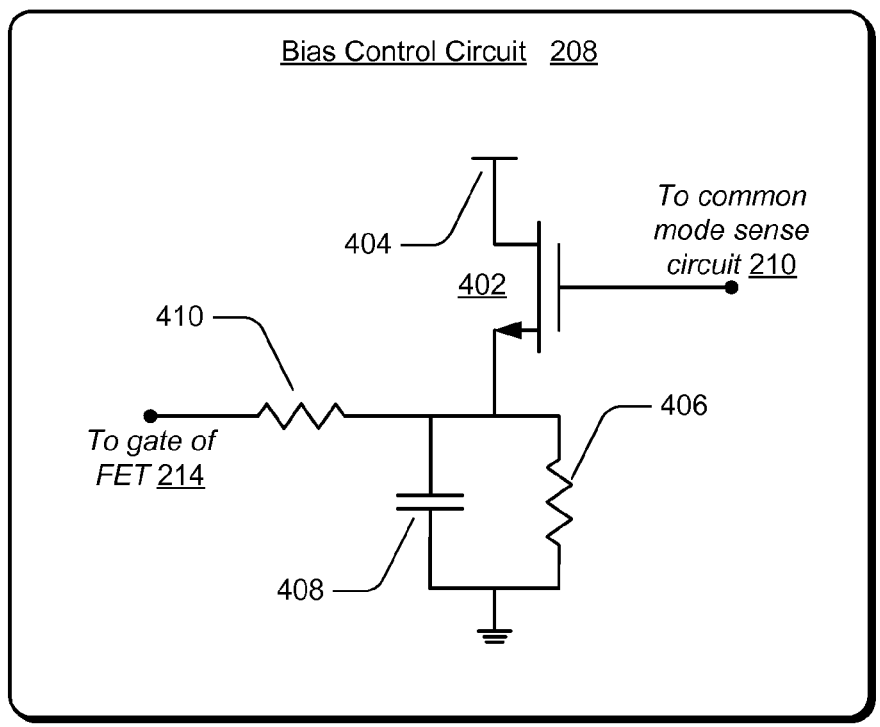
FIG. 4 further illustrates an example bias control circuit in which aspects of a bias controller for use with a crystal oscillator can be implemented.

FIG. 4 illustrates an example circuit 400 in which aspects of a low phase noise technique implemented with a bias controller for use with a crystal oscillator can be implemented. The bias control circuit 208 (as shown and described with reference to FIG. 2) is implemented with a transistor 402 that replaces a conventional op-amp and reference voltage generator (as shown in FIG. 3). In implementations of the bias control circuit 208, the transistor 402 is a field effect transistor (FET), and a gate of the transistor is coupled to the common mode sense circuit 210, such as between the first resistor 218 and second resistor 220 (as shown in FIG. 2). A drain of the transistor 402 is coupled to a supply voltage 404. A source of the transistor 402 is coupled to a grounded resistor 406 and a grounded capacitor 408. The grounded resistor 406 and the grounded capacitor 408 can provide filtering, by shunting undesired frequencies to ground. A source of the transistor 402 is also coupled to a resistor 410, which is in turn coupled to the gate of the transistor 214. Hence, a source of the transistor 402 is resistively coupled to the gate of the transistor 214, and the transistor 402 is implemented in a source-follower configuration.

A sensed common mode signal from the common mode sense circuit 210 is supplied to the gate of the transistor 402, causing a required amount of the current according to an amount of swing in the sensed common mode signal to flow through the resistor 410. Since a required amount of current flows through the resistor 410, a bias voltage is thereby set on the gate of transistor 214. Further, the bias voltage is set on the gate of the transistor 214 without the use of an op-amp and voltage reference generator, and the resulting signal supplied to clock distribution circuitry is low noise and suitable for systems requiring low phase noise clocks, such as systems processing signals compliant with an IEEE 802.11ac regulatory standard. The bias control circuit 208 described herein is self-biased, in that it does not depend on an external reference voltage generator. Furthermore, the source-follower configuration of the transistor 402 supports high swings of sensed common mode signals, being able to set a bias voltage on the transistor 214 for such high swings of sensed common mode signals.

Figure 5:
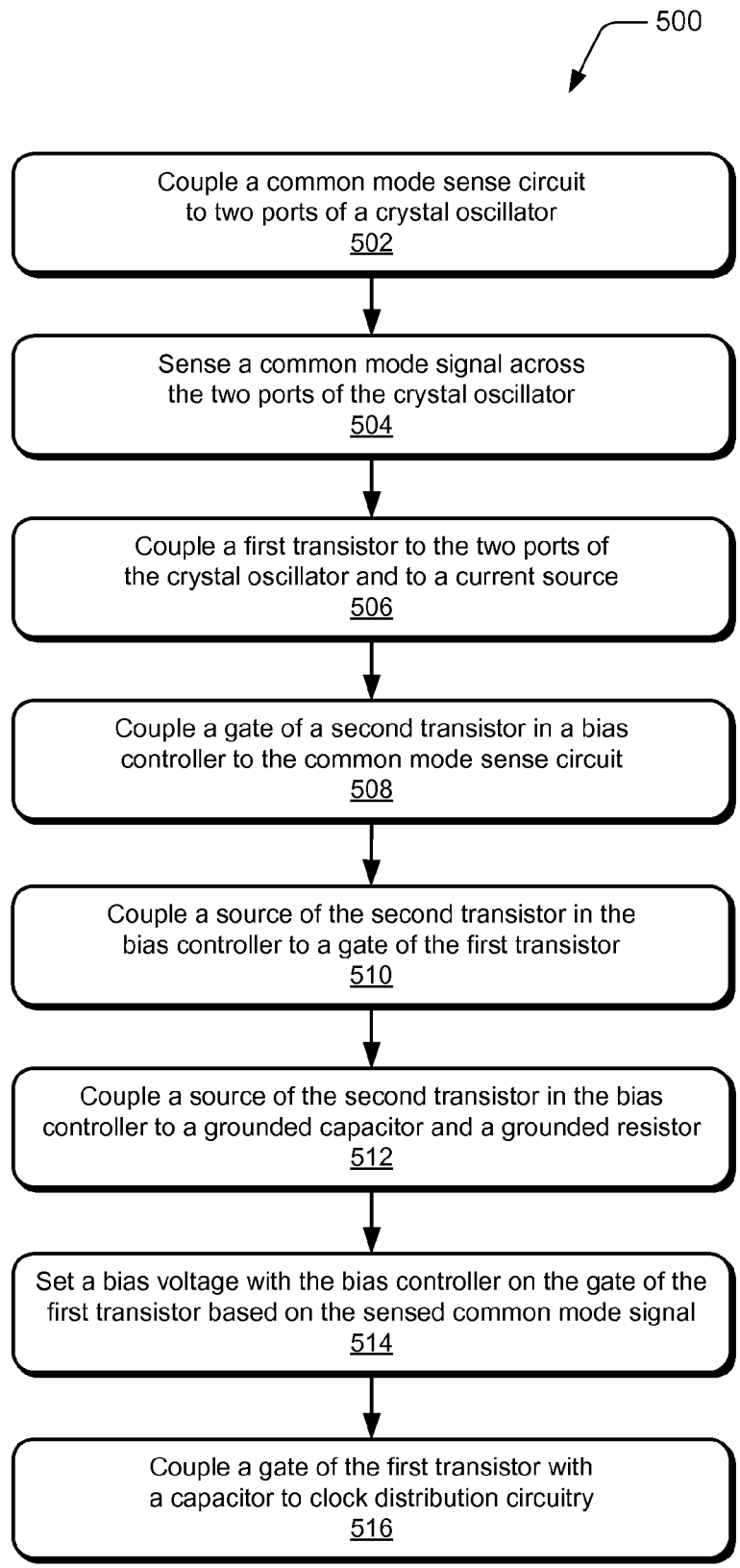
FIG. 5 illustrates example methods of a bias controller for use with a crystal oscillator in accordance with one or more aspects.

FIG. 5 illustrates an example method 500 in accordance with one or more aspects of a low phase noise technique implemented with a bias controller for use with a crystal oscillator. Generally, any of the components, modules, methods, and operations described herein can be implemented using software, firmware, hardware (e.g., fixed logic circuitry), manual processing, or any combination thereof. Some operations of the example methods may be described in the general context of executable instructions stored on computer-readable storage memory that is local and/or remote to a computer processing system, and implementations can include software applications, programs, functions, and the like. Alternatively or in addition, any of the functionality described herein can be performed, at least in part, by one or more hardware logic components, such as, and without limitation, field-programmable gate arrays (FPGAs), application-specific integrated circuits (ASICs), application-specific standard products (ASSPs), system-on-a-chip systems (SoCs), complex programmable logic devices (CPLDs), and the like.

FIG. 5 illustrates example method(s) 500 of a low phase noise technique implemented with a bias controller for use with a crystal oscillator. The order in which the method is described is not intended to be construed as a limitation, and any number of the described method operations can be combined in any order to implement the method, or an alternate method. The specific order or hierarchy of method operations may be re-arranged, amended, and/or modified without departing from the scope of the claimed subject matter.

At 502, a common mode sense circuit is coupled to two ports of a crystal oscillator. For example, the common mode sense circuit 210 can include a pair of resistors in series, as is illustrated in FIG. 2. Furthermore, the resistors may be equally valued. The two ports of the crystal oscillator can include an input port and an output port. At 504, a common mode signal is sensed across the two ports of the crystal oscillator. For example, the common mode signal is sensed with the common mode sense circuit 210.

At 506, a first transistor is coupled to two ports of the crystal oscillator. For example, the drain of the transistor 214 is coupled to the port 206-1 and the gate of the transistor 214 is coupled through capacitor 216 to port 206-2 in FIG. 2. Furthermore at 506, the first transistor is coupled to a current source. For example, the drain of the transistor 214 is further coupled to the current source 212. The current source may be under amplitude control to source or sink a required amount of current, such as an amount of current corresponding to the sensed common mode signal, such as an amount of swing of the sensed common mode signal.

At 508, a gate of a second transistor in a bias controller is coupled to a common mode sense circuit. For example, the gate of the transistor 402 is coupled to the common mode sense circuit 210 in FIG. 4. The coupling may be to a point in the common mode sense circuit between two the resistors in series, such as between the resistors 218 and 220 in FIG. 2.

At 510, a source of the second transistor in the bias controller is coupled to a gate of the first transistor. For example, in FIG. 4 the source of the transistor 402 is coupled through the resistor 410 to the gate of the transistor 214. Hence, the coupling can be resistive, converting a current flow to a voltage.

At 512, a source of the second transistor in the bias controller is coupled to a grounded capacitor and a grounded resistor. For example, in FIG. 4, the source of the transistor 402 is coupled to the resistor 406 and the capacitor 408, both of which are grounded. The grounded capacitor and the grounded resistor provide filtering of a voltage supplied to the transistor 214, by shunting undesired signal components to ground.

At 514, a bias voltage is set with a bias controller on a gate of the first transistor based on the sensed common mode signal. For example, the bias control circuit 208 in FIG. 4 accepts a sensed common mode signal from the common mode sense circuit and the transistor 402 sets a bias voltage on the transistor 214 through the resistor 410 based on the sensed common mode signal. Furthermore, the bias voltage may be set according to an amount of current to or from a current source. For example, in FIG. 2, the bias control circuit 208 sets a bias voltage on the gate of the transistor 214 needed to sink or source a required amount of current from the current source 212. The required amount of current may correspond to an amount of swing in the sensed common mode signal.

At 516, a gate of the first transistor is coupled with a capacitor to clock distribution circuitry. For example, in FIG. 2 the gate of the transistor 214 is coupled through the capacitor 216 to a node labeled "To Clock Distribution". Clock distribution may include clock distribution circuitry, such as an AC buffer, amplifier, phase-locked loop, direct digital synthesizer, filter, combinations thereof, and the like. The clock distribution circuitry derives a system clock for components of a chip and/or processor, such as chip 204 in FIG. 2.

Figure 6:
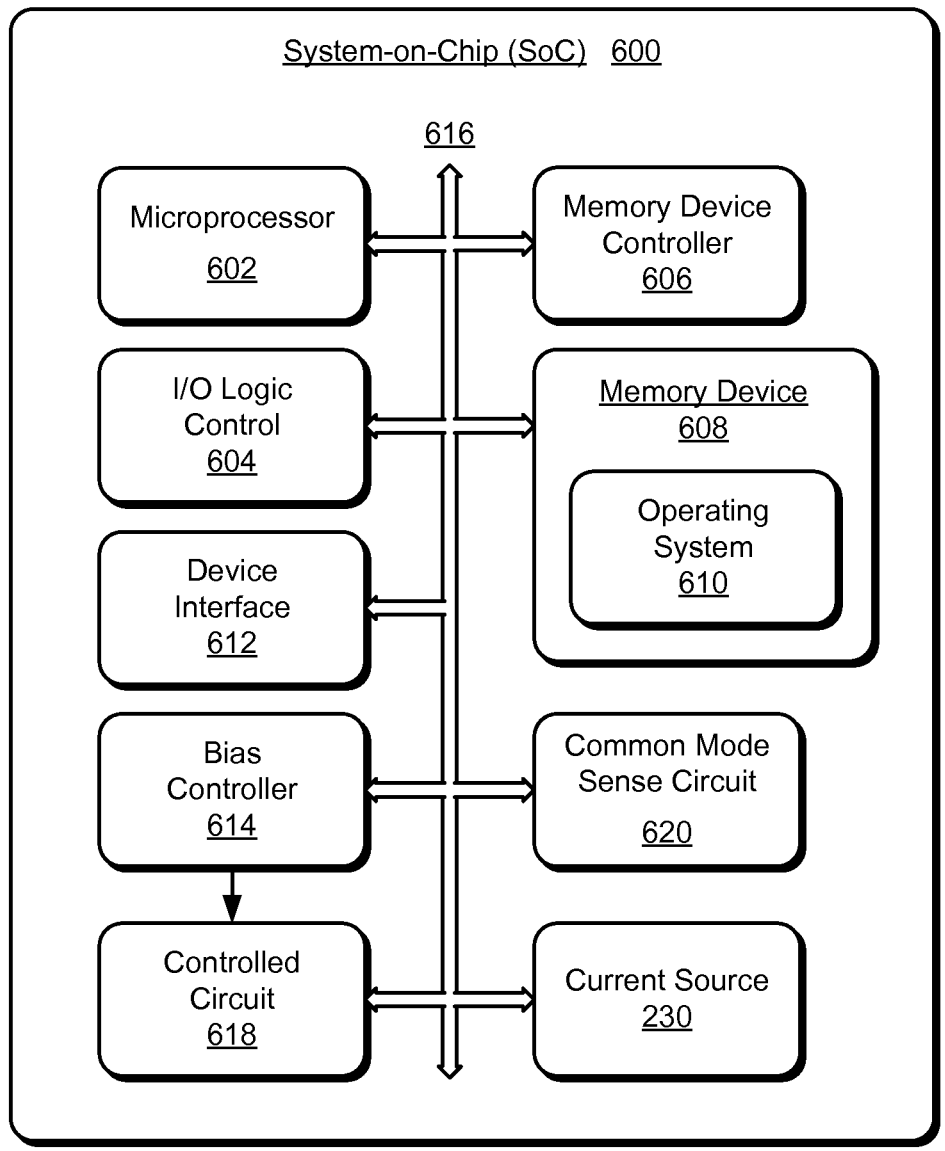
FIG. 6 illustrates an example system-on-chip (SoC) environment in which aspects of a bias controller for use with a crystal oscillator can be implemented.

FIG. 6 illustrates an example system-on-chip (SoC) 600, which can implement various aspects of a low phase noise technique implemented with a bias controller for use with a crystal oscillator, as described herein. The SoC may be implemented in any type of electronic or computing device that may be implemented as any type of computer, mobile phone, tablet device, digital camera, multimedia device, printer, or similar device. The SoC 600 can be integrated with electronic circuitry, a microprocessor, memory, input-output (I/O) logic control, communication interfaces and components, as well as other hardware, firmware, and/or software to implement an electronic or computing device.

In this example, the SoC 600 is integrated with a microprocessor 602 (e.g., any of a microcontroller or digital signal processor) and input-output (I/O) logic control 604 (e.g., to include electronic circuitry). The SoC 600 includes a memory device controller 606 and a memory device 608, such as any type of a nonvolatile memory and/or other suitable electronic data storage device. The SoC can also include various firmware and/or software, such as an operating system 610 that is maintained by the memory and executed by the microprocessor.

The SoC 600 includes a device interface 612 to interface with a device or other peripheral component, such as when installed in an electronic or computing device. The SoC 600 also includes an integrated data bus 616 that couples the various components of the SoC for data communication between the components. The data bus in the SoC may also be implemented as any one or a combination of different bus structures and/or bus architectures.

In aspects of a bias controller for use with a crystal oscillator, the SoC 600 includes a bias controller 614 of a controlled circuit 618 that may be implemented in connection with the I/O logic control 604 and/or other processing and circuits of the SoC 600. The bias controller 614 may comprise the bias control circuit 208 in FIG. 4, and the controlled circuit 618 may comprise the transistor 214 and/or the off-chip crystal 202 in FIG. 2. In this example, the SoC 600 also includes a current source 620, which may comprise the current source 212 in FIG. 2, and is implemented under amplitude control to source or sink a required amount of current. The SoC 600 also implements a common mode sense circuit 620 to sense a common mode signal, such as a common mode signal across two ports of a crystal oscillator. An example of a common mode sense circuit 620 is the common mode sense circuit 210 in FIG. 2, which includes the two resistors 218 and 220.

Figure 7:
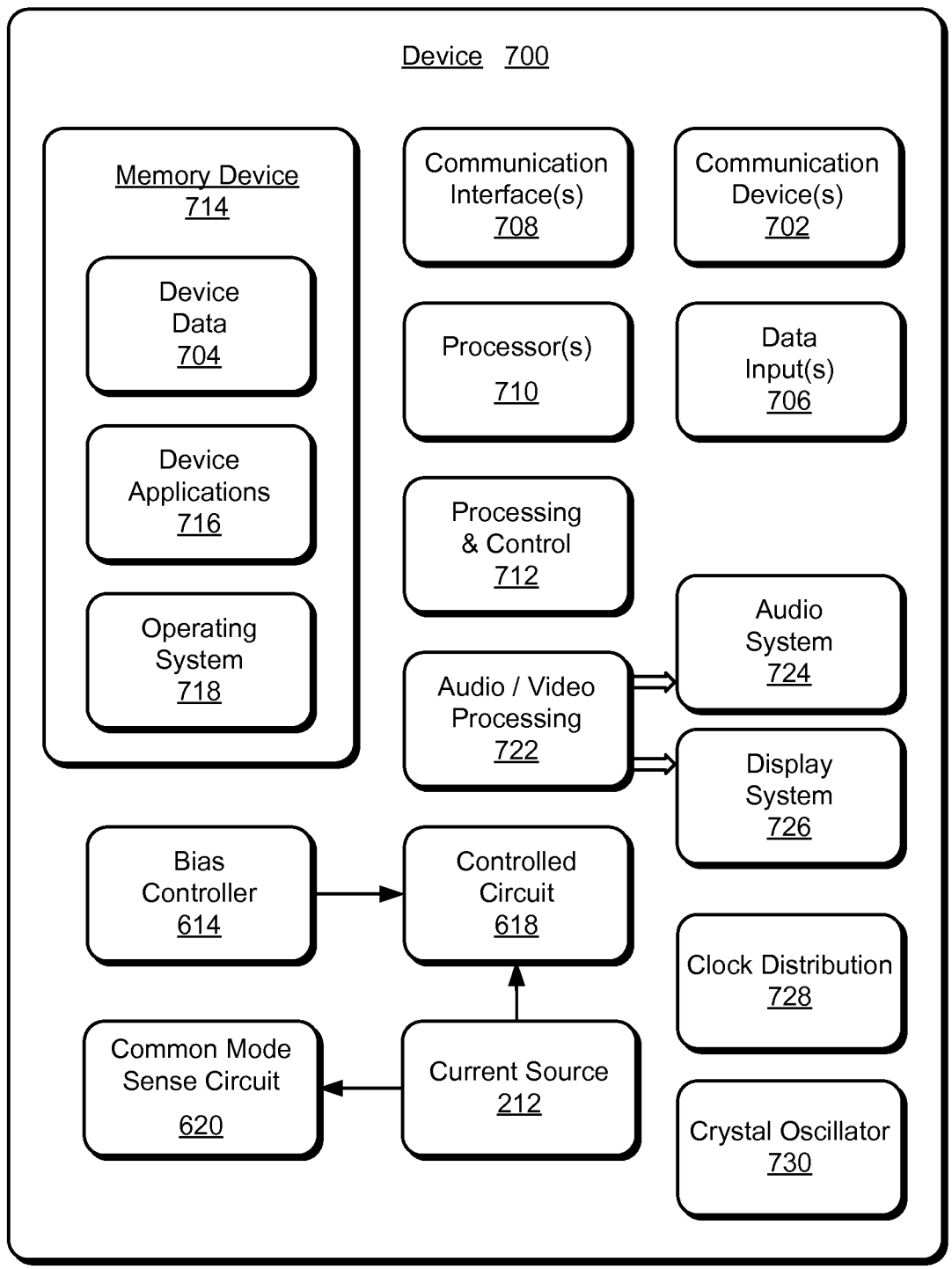
FIG. 7 illustrates various components of an example device that can implement aspects of a bias controller for use with a crystal oscillator.

FIG. 7 illustrates various components of an example device 700 that can be implemented as any of the devices or systems described with reference to the previous FIGS. 1-6, such as any type of an electronic or computing device. The device 700 may also be implemented to include the example system-on-chip (SoC) described with reference to FIG. 6. The device 700 may be associated with a user (i.e., a person) and/or an entity that operates the device such that a device describes logical devices that include users, software, firmware, hardware, and/or a combination of devices.

The device 700 includes communication devices 702 that enable wired and/or wireless communication of device data 704, such as received data, data that is communicated between devices, data packets of the data, etc. The device 700 also includes one or more data inputs 706 via which any type of data, media content, and/or inputs can be received, such as user-selectable inputs and any other type of audio, video, and/or image data received from any content and/or data source. The data inputs 706 may include USB ports, coaxial cable, and other serial or parallel connectors (including internal connectors) for flash memory, DVDs, CDs, and the like. The data inputs can be used to couple the device to internal and/or external components, peripherals, and accessories, such as keyboards, microphones, cameras, and any other types of devices. For example, a Wi-Fi connection may be used to couple data between devices that support an IEEE 802.11 standard, such as IEEE 802.11ac.

The device 700 also includes communication interfaces 708, such as any one or more of a serial, parallel, network, or wireless interface. The communication interfaces provide a connection and/or communication links between the device and a network by which other electronic, computing, and communication devices communicate data with the device. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 700 includes one or more processors 710 (e.g., any of microprocessors, controllers, and the like), or a processor and memory system (e.g., implemented in an SoC), which processes computer-executable instructions to control the operation of the device. Alternatively or in addition, the device can be implemented with any one or combination of software, hardware, firmware, or fixed logic circuitry that is implemented in connection with processing and control circuits which are generally identified at 712.

The device 700 also includes one or more memory devices 714 (e.g., computer-readable storage memory) that enable data storage, such as random access memory (RAM), non-volatile memory (e.g., read-only memory (ROM), flash memory, etc.), and a disk storage device. A disk storage device may be implemented as any type of magnetic or optical storage device, such as a hard disk drive, a recordable and/or rewriteable disc, and the like. The device may also include a mass storage media device. Computer-readable storage media can be any suitable electronic data storage that is accessed by a computing device.

A memory device 714 provides data storage mechanisms to store the device data 704, other types of information and/or data, and device applications 716. For example, an operating system 718 can be maintained as a software application with the memory device and executed on the processors. The device applications may include a device manager or controller, such as any form of a control application, software application, signal processing and control module, code that is native to a particular device, a hardware abstraction layer for a particular device, and so on.

The device 700 may also include an audio and/or video processing system 722 that generates audio data for an audio system 724 and/or generates display data for a display system 726. The audio system and/or the display system may include any devices that process, display, and/or otherwise render audio, video, display, and/or image data. In implementations, the audio system and/or the display system are external components to the device. Alternatively, the audio system and/or the display system are integrated components of the example device.

In this example, the device 700 includes a bias controller 614 that sets the bias voltage on controlled circuit 618. The bias voltage is set based on a sensed common mode signal in common mode sense circuit 620 across ports of a crystal oscillator 730, which may comprise the off-chip crystal 202. Furthermore, the current source 212 is coupled to the common mode sense circuit 620 and the controlled circuit 618, which includes at least the transistor 214. A clock distribution circuit 728 may also be coupled to the controlled circuit 618, such as through a capacitor (not shown). The clock distribution circuit 728 may include clock distribution circuitry, such as an AC buffer, amplifier, phase-locked loop, direct digital synthesizer, filter, combinations thereof, and the like. Clock distribution circuitry may derive a system clock for components of device 700.

Although aspects of a low phase noise technique implemented with a bias controller for use with a crystal oscillator have been described in language specific to features and/or methods, the appended claims are not necessarily limited to the specific features or methods described. Rather the specific features and methods are disclosed as example implementations of a bias controller for use with a crystal oscillator, and other equivalent features and methods are intended to be within the scope of the appended claims. Further, various different aspects are described and it is to be appreciated that each described aspect can be implemented independently or in connection with one or more other described aspects.

What is claimed is:

1. An electronic circuit for controlling a crystal oscillator, comprising:
    a common mode sense circuit coupled to two ports of the crystal oscillator and configured to sense a common mode signal across the two ports;
    a first transistor coupled to the two ports of the crystal oscillator; and
    a bias controller configured to set a bias voltage on a gate of the first transistor based on the sensed common mode signal, the bias controller including a second transistor, a gate of the second transistor being coupled to the common mode sense circuit, and a source of the second transistor being resistively coupled to the gate of the first transistor.

2. The electronic circuit as recited in claim 1, wherein the common mode sense circuit comprises a pair of equally-valued resistors.

3. The electronic circuit as recited in claim 1, wherein the common mode sense circuit, the first transistor, and the bias controller comprise a first chip and the crystal oscillator comprises a second chip.

4. The electronic circuit as recited in claim 1, wherein the first transistor is further coupled to a current source.

5. The electronic circuit as recited in claim 4, wherein the bias voltage is further set according to an amount of current to or from the current source.

6. The electronic circuit as recited in claim 1, wherein the gate of the first transistor is further coupled with a capacitor to clock distribution circuitry.

7. The electronic circuit as recited in claim 6, wherein the clock distribution circuitry generates clocks for processing of signals compliant with an IEEE 802.11ac standard.

8. The electronic circuit as recited in claim 1, wherein at least one of the first transistor and the second transistor is a field effect transistor (FET).

9. The electronic circuit as recited in claim 1, wherein the source of the second transistor is further coupled to a grounded capacitor and a grounded resistor.

10. The electronic circuit as recited in claim 1, wherein the common mode sense circuit, the first transistor, and the bias controller are embodied on a system-on-chip (SoC).

11. A method for controlling a crystal oscillator, comprising:
coupling a common mode sense circuit to two ports of the crystal oscillator;
sensing a common mode signal across the two ports of the crystal oscillator;
coupling a first transistor to the two ports of the crystal oscillator;
coupling a gate of a second transistor in a bias controller to the common mode sense circuit;
coupling a source of the second transistor in the bias controller to a gate of the first transistor; and
setting a bias voltage with the bias controller on the gate of the first transistor based on the sensed common mode signal.

12. The method as recited in claim 11, wherein the common mode sense circuit comprises a pair of equally-valued resistors.

13. The method as recited in claim 11, wherein the common mode sense circuit, the first transistor, and the bias controller comprise a first chip and the crystal oscillator comprises a second chip.

14. The method as recited in claim 11, further comprising coupling the first transistor to a current source, and wherein the setting of the bias voltage is further according to an amount of current to or from the current source.

15. The method as recited in claim 11, further comprising coupling the gate of the first transistor with a capacitor to clock distribution circuitry.

16. The method as recited in claim 11, wherein at least one of the first transistor and the second transistor is a field effect transistor (FET).

17. The method as recited in claim 11, further comprising coupling the source of the second transistor to a grounded capacitor and a grounded resistor.

18. A system, comprising:
a crystal oscillator;
a common mode sense circuit coupled to two ports of the crystal oscillator and configured to sense a common mode signal across the two ports;
a first transistor coupled to the two ports of the crystal oscillator; and
a bias controller comprising a second transistor with a gate coupled to the common mode sense circuit and a source coupled to the gate of the first transistor, and the bias controller configured to set a bias voltage on the gate of the first transistor based on the sensed common mode signal.

19. The system as recited in claim 18, wherein the common mode sense circuit, the first transistor, and the bias controller comprise a first chip and the crystal oscillator comprises a second chip.

20. The system as recited in claim 18, further comprising a current source coupled to the first transistor, and wherein the bias voltage is further set according to an amount of current to or from the current source.

* * * * *